(12) United States Patent
Mitsumori

(10) Patent No.: US 9,065,360 B2
(45) Date of Patent: Jun. 23, 2015

(54) POLYMER ACTUATOR DEVICE SYSTEM

(71) Applicant: ALPS ELECTRIC CO., LTD., Tokyo (JP)

(72) Inventor: Kenichi Mitsumori, Miyagi-Ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 247 days.

(21) Appl. No.: 13/911,812

(22) Filed: Jun. 6, 2013

(65) Prior Publication Data

US 2013/0328441 A1 Dec. 12, 2013

(30) Foreign Application Priority Data

Jun. 8, 2012 (JP) .................. 2012-131113

(51) Int. Cl.
*H01L 41/08* (2006.01)
*H02N 11/00* (2006.01)
*H01L 41/193* (2006.01)
*F03G 7/00* (2006.01)

(52) U.S. Cl.
CPC ............ *H02N 11/006* (2013.01); *H01L 41/193* (2013.01); *F03G 7/005* (2013.01)

(58) Field of Classification Search
CPC .............................. H01L 41/193; H01L 41/23
USPC ......................................... 310/328, 340, 800
See application file for complete search history.

(56) References Cited

U.S. PATENT DOCUMENTS

| | | | | |
|---|---|---|---|---|
| 4,080,276 A * | 3/1978 | Bode | .............................. | 204/429 |
| 4,096,048 A * | 6/1978 | Matsumoto et al. | ........... | 204/424 |
| 5,288,551 A * | 2/1994 | Sato et al. | ...................... | 428/334 |
| 5,556,700 A * | 9/1996 | Kaneto et al. | .................. | 428/332 |
| 5,977,685 A * | 11/1999 | Kurita et al. | ................... | 310/311 |
| 6,249,076 B1 * | 6/2001 | Madden et al. | ................ | 310/363 |
| 6,749,556 B2 * | 6/2004 | Banik | ............... | 600/30 |
| 7,583,009 B2 * | 9/2009 | Nagai et al. | .................... | 310/328 |
| 7,804,226 B2 * | 9/2010 | Asai | ............................... | 310/328 |
| 7,948,151 B1 * | 5/2011 | Blackburn et al. | ............. | 310/328 |
| 7,951,186 B2 * | 5/2011 | Eidenschink et al. | ........ | 623/1.11 |
| 8,034,046 B2 * | 10/2011 | Eidenschink | .................. | 604/531 |
| 8,294,329 B2 * | 10/2012 | Yamamoto et al. | ............ | 310/300 |

FOREIGN PATENT DOCUMENTS

JP 2008-35682 2/2008

* cited by examiner

*Primary Examiner* — J. San Martin
(74) *Attorney, Agent, or Firm* — Brinks Gilson & Lione

(57) ABSTRACT

A polymer actuator device system includes: a polymer actuator which includes an electrolyte layer, a first electrode layer and a second electrode layer provided to oppose each other with the electrolyte layer interposed therebetween in a thickness direction of the electrolyte layer, and deforms in response to a voltage between the first and second electrode layers; and a sealing member which coats an entirety of the polymer actuator to be enclosed therein. The sealing member has two layers of a resin layer and an inorganic layer, a thickness of the sealing member is 1 to 5 microns, and an outer side of the sealing member in the thickness direction has a wear preventing body.

6 Claims, 13 Drawing Sheets

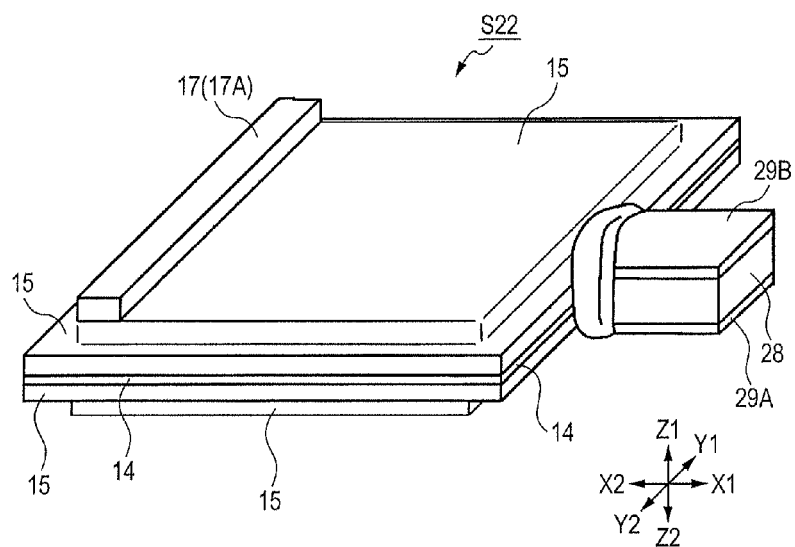
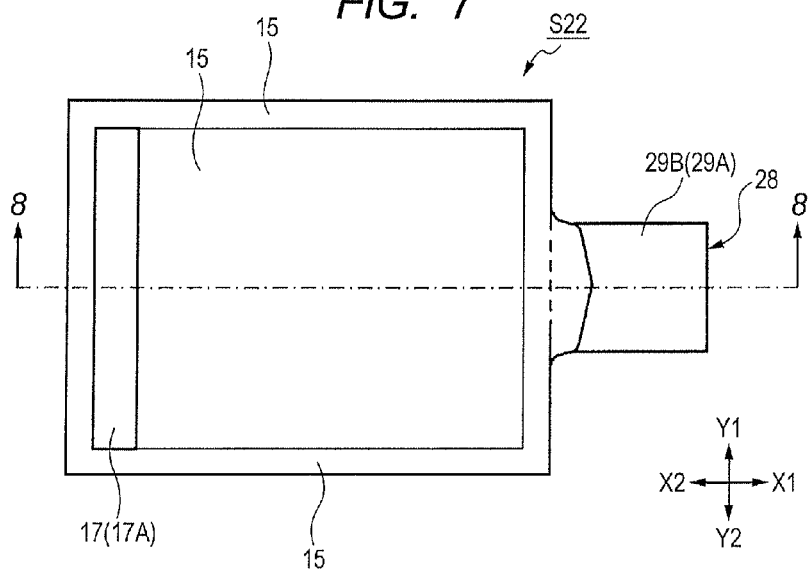

POLYMER ACTUATOR DEVICE SYSTEM

CLAIM OF PRIORITY

This application claims benefit of Japanese Patent Application No. 2012-131113 filed on Jun. 8, 2012, which is hereby incorporated by reference in its entirety.

BACKGROUND

1. Field of the Disclosure

The present disclosure relates to a polymer actuator which deforms in response to a voltage between electrode layers, and more particularly, to a polymer actuator device system having an improved layer configuration.

2. Description of the Related Art

In various electronic devices, the need has increased for an actuator which has a small size, a light weight, and sufficient flexibility, and a polymer extension type polymer actuator has been expected.

There is a polymer actuator which uses water as an electrolyte. Since the polymer actuator does not operate when moisture is evaporated, a sealing structure which coats the entirety of the polymer actuator to be enclosed therein is employed. In addition, even in a case where those such as an organic solvent and an ionic liquid other than water are used as the electrolyte, there may be cases where the same sealing structure is needed to avoid an adverse effect of condensation, excessive moisture, or the like.

As the polymer actuator employing such a sealing structure, an actuator 900 illustrated in FIG. 22 is suggested in Japanese Unexamined Patent Application Publication No. 2008-35682. FIG. 22 is a cross-sectional view illustrating the structure of the actuator 900 of an example according to the related art. The actuator 900 illustrated in FIG. 22 is configured by including an actuator main body 915, an electrode 925a and an electrode 925b disposed with the actuator main body 915 interposed therebetween, metal layers 944 disposed on the outer sides of the electrodes 925a and 925b, conductive wires 942 which apply a voltage to the electrodes 925a and 925b, and a sealing film 930 which coats the entirety thereof to be enclosed therein. In addition, the sealing film 930 has a performance of blocking outside air. Accordingly, the actuator main body 915 and the electrodes 925a and 925b are blocked from the outside, and thus the actuator 900 can be stably operated while reliably maintaining its characteristics over a long period of time in various atmospheres such as water, solvents, and air. Moreover, the sealing film 930 is operated to protect the entirety of the actuator (the actuator main body 915 and the electrodes 925a and 925b).

However, although this type of sealing film 930 protects the entirety of the actuator due to a large film thickness and can block the entirety of the actuator from the outside, due to the large film thickness, there is a problem in that the sealing film 930 has an adverse effect and impedes the deformation of the actuator. Here, it is thought that a sealing member may be made as thin as possible so as not to have an effect on the deformation of the actuator. However, if the sealing member is simply made thin, when an external force is exerted on the actuator, the sealing member is broken, and thus there is a new problem in that the life span of the actuator is reduced.

SUMMARY

A polymer actuator device system includes: a polymer actuator which includes an electrolyte layer, a first electrode layer and a second electrode layer provided to oppose each other with the electrolyte layer interposed therebetween in a thickness direction of the electrolyte layer, and deforms in response to a voltage between the first and second electrode layers; and a sealing member which coats an entirety of the polymer actuator to be enclosed therein. The sealing member has two layers of a resin layer and an inorganic layer, a thickness of the sealing member is 1 to 5 microns, and an outer side of the sealing member in the thickness direction has a wear preventing body.

BRIEF DESCRIPTION OF THE DRAWINGS

FIG. 6 is a schematic diagram illustrating a polymer actuator device system of a second embodiment of the invention, and is a perspective view of the polymer actuator device system.

FIG. 7 is a schematic diagram illustrating the polymer actuator device system of the second embodiment of the invention, and is a plan view viewed from a Z1 side illustrated in FIG. 6.

FIG. 19A is a plan view of a polymer actuator device system of a modification example 1 compared to FIG. 2, and FIG. 19B is a plan view of a polymer actuator device system of a modification example 2 compared to FIG. 2.

FIG. 20A is a perspective view of a polymer actuator device system of a modification example 3 compared to FIG. 6, and FIG. 20B is a cross-sectional view of a polymer actuator device system of a modification example 4 compared to FIG. 8.

DESCRIPTION OF THE PREFERRED EMBODIMENTS

Hereinafter, embodiments of the invention will be described in detail with reference to the drawings.

First Embodiment

Figure 1:
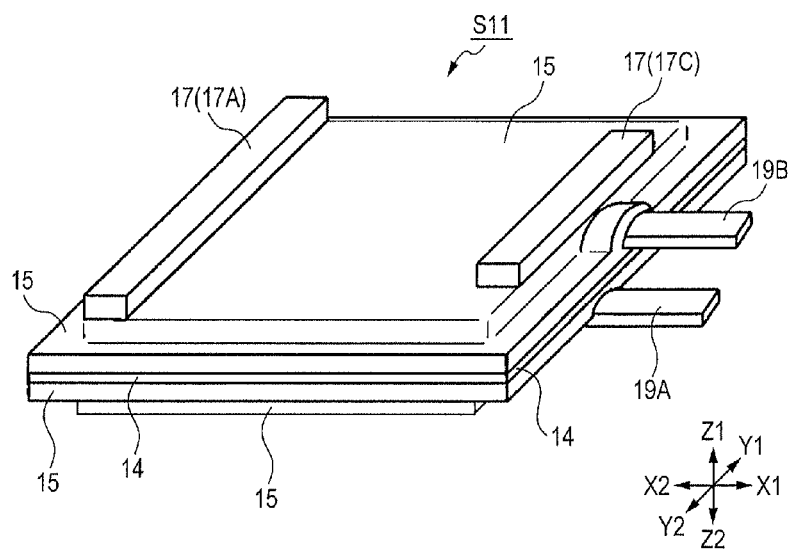
FIG. 1 is a schematic diagram illustrating a polymer actuator device system of a first embodiment of the invention, and is a perspective view of the polymer actuator device system.
Figure 2:
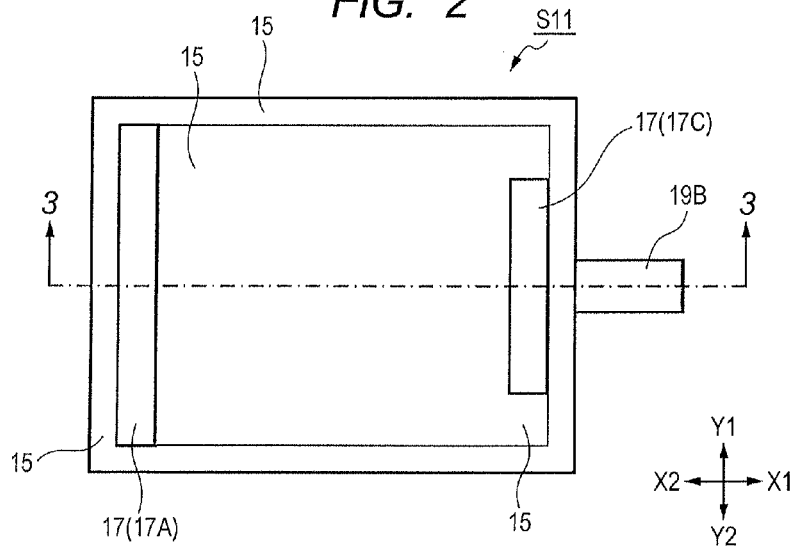
FIG. 2 is a schematic diagram illustrating the polymer actuator device system of the first embodiment of the invention, and is a plan view viewed from a Z1 side illustrated in FIG. 1.
Figure 3:
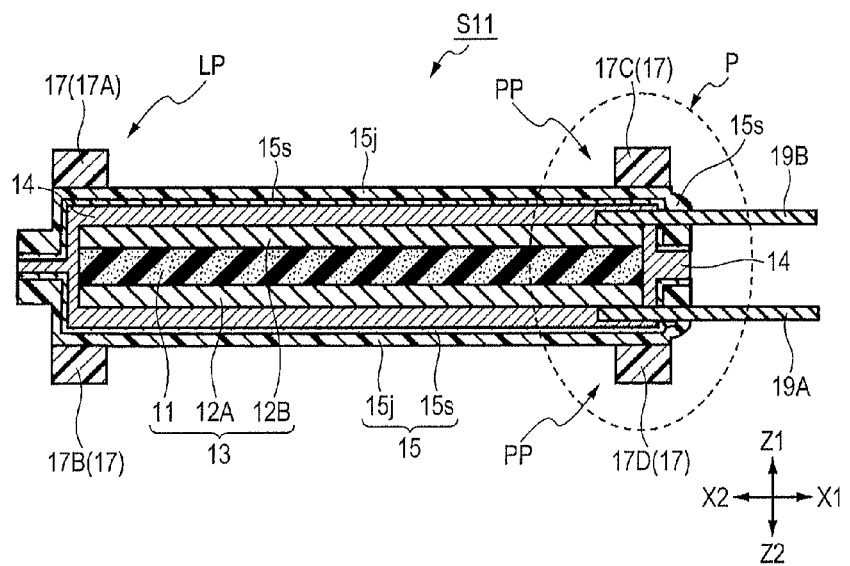
FIG. 3 is a schematic diagram illustrating the polymer actuator device system of the first embodiment of the invention, and is a cross-sectional view taken along line III-III illustrated in FIG. 2.

FIG. 1 is a schematic diagram illustrating a polymer actuator device system S11 of a first embodiment of the invention, and is a perspective view of the polymer actuator device system S11. FIG. 2 is a schematic diagram illustrating the polymer actuator device system S11 of the first embodiment of the invention, and is a plan view viewed from a Z1 side illustrated in FIG. 1. FIG. 3 is a schematic diagram illustrating the polymer actuator device system S11 of the first embodiment of the invention, and is a cross-sectional view taken along line illustrated in FIG. 2.

Figure 4:
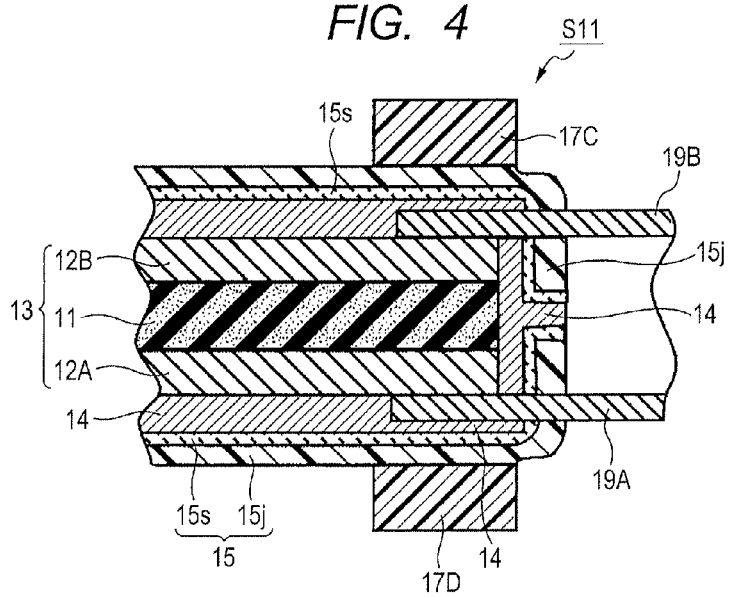
FIG. 4 is a schematic diagram illustrating the polymer actuator device system of the first embodiment of the invention, and is an enlarged cross-sectional view of a part P illustrated in FIG. 3.

FIG. 4 is a schematic diagram illustrating the polymer actuator device system S11 of the first embodiment of the invention, and is an enlarged cross-sectional view of a part P illustrated in FIG. 3.

The polymer actuator device system S11 of the first embodiment of the invention is configured by including, as illustrated in FIGS. 1 to 4, a polymer actuator 13 which deforms in response to a voltage, a sealing member 15 which coats the entirety of the polymer actuator to be enclosed therein, and a plurality of wear preventing bodies 17 arranged on the outer side in the thickness direction of the sealing member 15. Moreover, a pair of terminals (a first terminal 19A and a second terminal 19B) for applying a voltage to the polymer actuator 13 are provided.

The polymer actuator 13 is configured by including an electrolyte layer 11, a first electrode layer 12A provided in the thickness direction of the electrolyte layer 11, and a second electrode layer 12B which opposes the first electrode layer 12A with the electrolyte layer 11 interposed therebetween. In addition, when power is supplied from the first terminal 19A electrically connected to the first electrode layer 12A and the second terminal 19B electrically connected to the second electrode layer 12B, the polymer actuator 13 deforms in response to the voltage between the first and second electrode layers 12A and 12B.

Figure 5A:
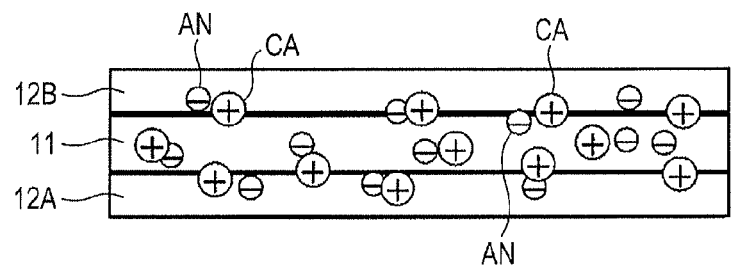
FIGS. 5A and 5B are schematic diagrams illustrating the operation principle of the polymer actuator used in the polymer actuator device system of the first embodiment of the invention.
Figure 5B:
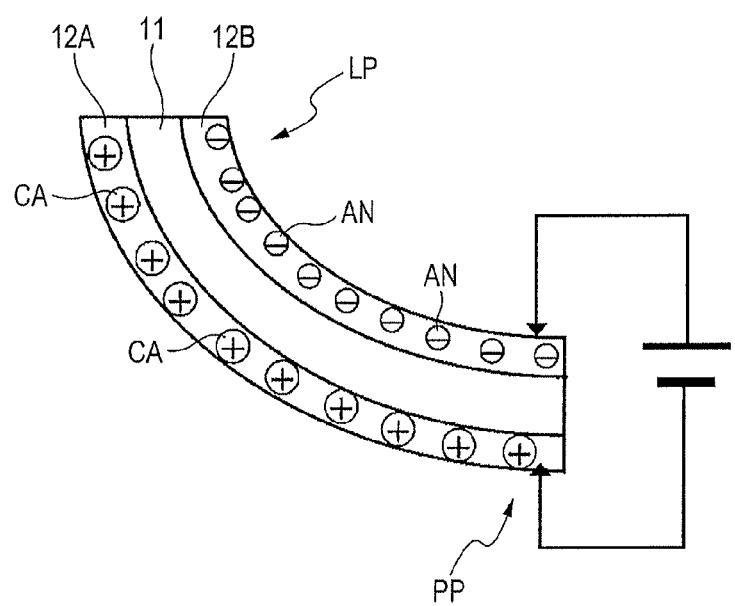

Here, the operation principle of the ion conduction type polymer actuator 13 used in the polymer actuator device system S11 of the first embodiment of the invention will be simply described. FIGS. 5A and 5B are schematic diagrams illustrating the operation principle of the ion conduction type polymer actuator 13, FIG. 5A is a diagram schematically illustrating ions in the electrolyte layer 11 and the pair of electrode layers (12A and 12B) of the first embodiment of the invention, and FIG. 5B illustrates a state where a voltage is applied to the electrode layers (12A and 12B) of the first embodiment of the invention.

As illustrated in FIG. 5A, the ion conduction type polymer actuator 13 has the first and second electrode layers 12A and 12B which are disposed to oppose each other, and the electrolyte layer 11 provided between the first and second electrode layers 12A and 12B, and in each of the layers, cations CA and anions AN are dispersed. In addition, as illustrated in FIG. 5B, when a voltage is applied between the first and second electrode layers 12A and 12B, an electric field is generated in the electrolyte layer 11 interposed between the first and second electrode layers 12A and 12B, and thus the cations CA move to the first electrode layer 12A and the anions AN move to the second electrode layer 12B. Therefore, when one side of the polymer actuator 13 is supported to act as a fulcrum PP (support part), the other side thereof is significantly displaced in response to the direction of the electric field applied to the polymer actuator 13. In addition, when the other side of the polymer actuator 13 acts as a point of application LP (application part), the polymer actuator 13 can be used as various actuators. In addition, by changing the direction of the electric field applied to the polymer actuator 13, the action direction of the polymer actuator 13 may be changed, and by changing the strength of the voltage applied to the polymer actuator 13, the amount thereof deformed in response to the voltage may be changed.

Next, the polymer actuator 13 described above will be described in detail. The electrolyte layer 11 is a gel-like film in which a polymer (resin material) as a base is mixed with an ionic liquid, and as illustrated in FIGS. 3 and 4, is interposed between the first and second electrode layers 12A and 12B. Manufacture of the electrolyte layer 11 is performed by dissolving the ionic liquid and the resin material (polymer) in a solvent to manufacture a casting liquid, casting the casting liquid using a mold form, and evaporating the solvent through vacuum drying. In addition, as the material of the polymer (resin material) of the electrolyte layer 11, for example, polyvinylidene fluoride (PVDF), poly(methyl methacrylate) (PMMA), and the like may be used.

The first and second electrode layers 12A and 12B are configured by including a polymer (resin material) that becomes the same base as the electrolyte layer 11, an ionic liquid, and a conductive filler, and are in a gel-like state due to mixing of the conductive filler with the polymer (resin material) and the ionic liquid. As the conductive filler of the first and second electrode layers 12A and 12B, carbon nanotubes, carbon fiber, gold particles, platinum particles, nickel particles, and the like may be used. When the electrolyte layer 11 and the first and second electrode layers 12A and 12B configured as described above are used, a large displacement can be obtained at a low voltage.

In addition, the end portion of the first electrode layer 12A of the polymer actuator 13 and the end portion of one side of the first terminal 19A are disposed to abut each other so that the first electrode layer 12A and the first terminal 19A are electrically connected. Similarly, the end portion of the second electrode layer 12B of the polymer actuator 13 and the end portion of one side of the second terminal 19B are disposed to abut each other so that the second electrode layer 12B and the second terminal 19B are electrically connected. In addition, the other side of the first terminal 19A extends to penetrate the sealing member 15, and the other side of the second terminal 19B extends to penetrate the sealing member 15. In addition, a voltage can be applied to the polymer actuator 13 from the first and second terminals 19A and 19B.

As illustrated in FIGS. 3 and 4, the sealing member 15 is configured by including two layers of a resin layer 15j and an inorganic layer 15s and coats the entirety of the polymer actuator 13 to be enclosed therein. In addition, the sealing member 15 has a property of not having moisture penetrating therethrough regardless that the sealing member 15 has a very small thickness of 1 to 5 microns. In addition, since the thickness of the sealing member 15 is 1 to 5 microns and is thus very small, the sealing member 15 does not have an adverse effect on the deformation of the polymer actuator 13. In addition, one side of the sealing member 15 is provided with an adhesive layer 14 so that the sealing member 15 adheres to each of the first and second electrode layers 12A and 12B and the first and second terminals 19A and 19B by the adhesive layer 14.

Manufacture of the sealing member 15 is performed by forming a film of the inorganic layer 15s on one side surface of the resin layer 15j by using a chemical vapor deposition method (CVD) in which, for example, a polyphenylene sulfide resin film (PPS film) is used as the resin layer 15j of the sealing member 15 and, for example, a silicon carbonitride film (SiCN) is used as the inorganic layer 15s of the sealing member 15. In the first embodiment of the invention, manufacture was performed using the polyphenylene sulfide resin film having a thickness of about 1.2 microns, and the silicon carbonitride film having a thickness of about 0.02 microns. Since the inorganic layer 15s has a good barrier property against moisture, the sealing member 15 has a property of not having moisture penetrating therethrough regardless of a very small thickness. Accordingly, the sealing member 15 does not have an adverse effect on the deformation of the polymer actuator 13 and can block the polymer actuator 13 from the outside air. Accordingly, infiltration of moisture from the outside air to the polymer actuator 13 can be prevented. In addition, although the silicon carbonitride film (SiCN) was appropriately used as the inorganic layer 15s, an alumina film ($Al_2O_3$), a silica film ($SiO_2$), a silicon nitride film (SiN), and the like may also be used.

The wear preventing bodies 17 are made of a synthetic resin, for example, a film material having a small frictional coefficient such as polyethylene terephthalate (PET), and as illustrated in FIGS. 1 to 4, are provided at four points on the outer side in the thickness direction of the sealing member 15. In addition, as illustrated in FIG. 3, the wear preventing bodies 17A and 17B are vertically disposed to have the application part LP (the point of application) interposed therebetween, which is operated by driving the polymer actuator device system S11, and as illustrated in FIGS. 3 and 4, the wear preventing bodies 17C and 17D are vertically provided to have the support part PP (fulcrum) of the polymer actuator device system S11 interposed therebetween.

As described above using FIG. 5, in the polymer actuator 13, one side is fixed (the support part PP) and the other side is bent and deformed. Therefore, when a certain object is driven, the application part LP is more likely to be driven while sliding, and there is a concern that the thin sealing member 15 may be damaged. Therefore, friction during sliding is reduced by the wear preventing bodies 17 (17A and 17B), thereby preventing the sealing member 15 from being damaged. Accordingly, the sealing member 15 can be prevented from being broken, and thus the life span of the polymer actuator device system S11 can be further increased. In addition, since the polymer actuator device system S11 is used by supporting the support part PP, there is a concern that the thin sealing member 15 of the support part PP may be damaged. Therefore, a force exerted on the support part PP is distributed and reduced by the wear preventing bodies 17 (17C and 17D), thereby preventing the sealing member 15 from being damaged. Accordingly, the sealing member 15 can be prevented from being broken, and thus the life span of the polymer actuator device system S11 can be further increased.

Accordingly, since the polymer actuator device system S11 of the invention uses a type of film having two layers of the resin layer 15j and the inorganic layer 15s as the sealing member 15, the sealing member 15 does not have an adverse effect on the deformation of the polymer actuator 13 regardless of a small thickness of 1 to 5 microns and can block the polymer actuator 13 from the outside air. Therefore, infiltration of moisture from the outside air to the polymer actuator 13 can be prevented. In addition, due to the configuration in which the wear preventing bodies 17 are provided on the outer side of the sealing member 15, even when a force is to be exerted on the sealing member 15 from the outside, the sealing member 15 can be prevented from being damaged by the wear preventing bodies 17. Accordingly, the sealing member 15 can be prevented from being broken, and thus the life span of the polymer actuator device system S11 can be further increased. Therefore, the polymer actuator device system S11, which uses the sealing member 15 that has a sufficient sealing effect and does not impede the deformation of the polymer actuator 13, and thus has a long life span can be provided.

In addition, since the wear preventing bodies 17 are provided at the application part LP and the support part PP of the polymer actuator device system S11, even when a force is exerted on the application part LP or the support part PP on which the strongest force is exerted from the outside, the sealing member 15 can be further prevented from being damaged by the wear preventing bodies 17. Accordingly, the sealing member 15 can be prevented from being broken, and thus the life span of the polymer actuator device system S11 can be further increased.

Second Embodiment

Figure 8:
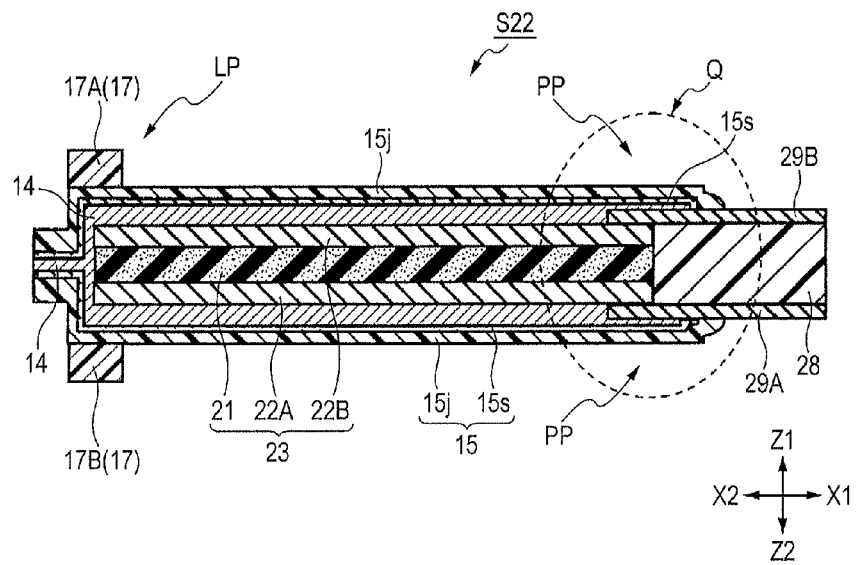
FIG. 8 is a schematic diagram illustrating the polymer actuator device system of the second embodiment of the invention, and is a cross-sectional view taken along line VIII-VIII illustrated in FIG. 7.
Figure 9:
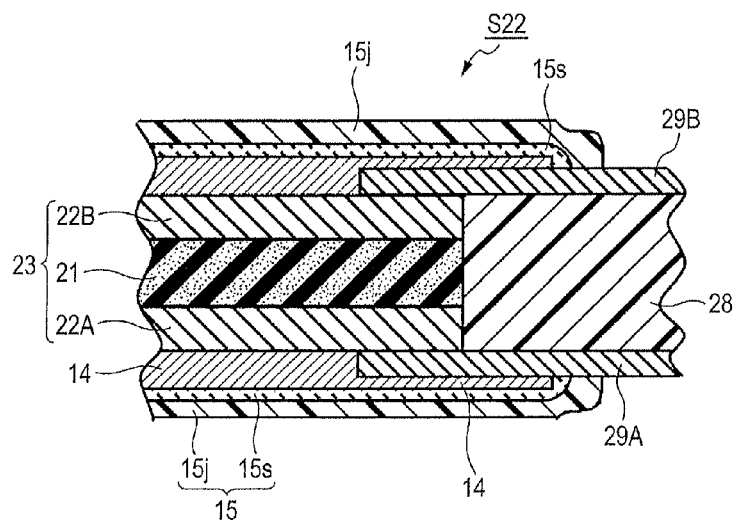
FIG. 9 is a schematic diagram illustrating the polymer actuator device system of the second embodiment of the invention, and is an enlarged cross-sectional view of a part Q illustrated in FIG. 8.

FIG. 6 is a schematic diagram illustrating a polymer actuator device system S22 of a second embodiment of the invention, and is a perspective view of the polymer actuator device system S22. FIG. 7 is a schematic diagram illustrating the polymer actuator device system S22 of the second embodiment of the invention, and is a plan view viewed from a Z1 side illustrated in FIG. 6. FIG. 8 is a schematic diagram illustrating the polymer actuator device system S22 of the second embodiment of the invention, and is a cross-sectional view taken along line VIII-VIII illustrated in FIG. 7. FIG. 9 is a schematic diagram illustrating the polymer actuator device system S22 of the second embodiment of the invention, and is an enlarged cross-sectional view of a part Q illustrated in FIG. 8. The polymer actuator device system S22 of the second embodiment is different from that of the first embodiment in that a structure 28 is provided. In addition, like elements that are the same as those of the first embodiment are denoted by like reference numerals, and detailed description thereof will be omitted.

The polymer actuator device system S22 of the second embodiment of the invention is configured by including, as illustrated in FIGS. 6 to 9, a polymer actuator 23 which deforms in response to a voltage, the sealing member 15 which coats the entirety of the polymer actuator 23 to be enclosed therein, the plurality of wear preventing bodies 17 arranged on the outer side in the thickness direction of the sealing member 15, a pair of terminals (a first terminal 29A and a second terminal 29B) for applying a voltage to the polymer actuator 23, and the structure 28 interposed between the first and second terminals 29A and 29B.

As illustrated in FIGS. 8 and 9, the polymer actuator 23 is configured by including an electrolyte layer 21, a first electrode layer 22A provided in the thickness direction of the electrolyte layer 21, and a second electrode layer 22B which opposes the first electrode layer 22A with the electrolyte layer 21 interposed therebetween. In addition, as described above using FIGS. 5A and 5B, when power is supplied from the first terminal 29A electrically connected to the first electrode layer 22A and the second terminal 29B electrically connected to the second electrode layer 22B, the polymer actuator 23 deforms in response to the voltage between the first and second electrode layers 22A and 22B. In addition, the electrolyte layer 21 of the polymer actuator 23 uses a water-soluble polymer electrolytic liquid, and the first and second electrode layers 22A and 22B use a metal thin film such as gold.

As illustrated in FIGS. 8 and 9, regarding the first terminal 29A, the end portion of the first electrode layer 22A of the polymer actuator 23 and the end portion of one side of the first terminal 29A are disposed to abut each other so that the first electrode layer 22A and the first terminal 29A are electrically connected. Similarly, regarding the second terminal 29B, the end portion of the second electrode layer 22B of the polymer actuator 23 and the end portion of one side of the second terminal 29B are disposed to abut each other so that the second electrode layer 22B and the second terminal 29B are electrically connected. In addition, the other side of the first terminal 29A extends to penetrate the sealing member 15, and the other side of the second terminal 29B extends to penetrate the sealing member 15. In addition, a voltage can be applied to the polymer actuator 23 from the first and second terminals 29A and 29B.

The structure 28 has a sheet-like shape as illustrated in FIGS. 6, 8, and 9 by using a synthetic resin such as polyethylene terephthalate (PET) and is disposed at a position interposed between the first and second terminals 29A and 29B. In addition, portions of the first and second terminals 29A and 29B and a portion of the structure 28 are covered with the sealing member 15 described later.

As in the first embodiment, the sealing member 15 is configured by including two layers of the resin layer 15j and the inorganic layer 15s as illustrated in FIGS. 8 and 9, and coats the entirety of the polymer actuator 23 to be enclosed therein as illustrated in FIGS. 6 to 9. In addition, as in the first embodiment, one side of the sealing member 15 is provided with the adhesive layer 14 so that the sealing member 15 adheres to each of the first and second electrode layers 22A and 22B and the first and second terminals 29A and 29B by the adhesive layer 14. Accordingly, since the thickness of the sealing member 15 is 1 to 5 microns and is thus very small, the sealing member 15 does not have an adverse effect on the deformation of the polymer actuator 23 and can block the polymer actuator 23 from the outside air. Accordingly, emission of moisture from the polymer actuator 23 to the outside can be prevented.

The wear preventing bodies 17 are made of a synthetic resin, for example, a film material having a small frictional coefficient such as polyethylene terephthalate (PET), and as illustrated in FIGS. 6 to 9, are provided at two points on the outer side in the thickness direction of the sealing member 15. As illustrated in FIG. 8, the wear preventing bodies 17A and 17B are vertically disposed to have the application part LP (the point of application) interposed therebetween, which is operated by driving the polymer actuator device system S22.

As described above using FIG. 5, the polymer actuator 23 is configured so that one side thereof is fixed (the support part PP) and the other side thereof is bent and deformed to drive a certain object (the application part LP). Therefore, since the polymer actuator device system S22 is used by supporting the support part PP, there is a concern that the thin sealing member 15 of the support part PP may be damaged. Here, when the terminal parts (parts of the first and second terminals 29A and 29B) reinforced by the structure 28 act as the support part PP of the polymer actuator device system S22, the sealing member 15 of the support part PP can be prevented from being damaged. In addition, the application part LP that drives a certain object is driven while sliding, and thus there is a concern that the thin sealing member 15 of the application part LP may be damaged. Therefore, friction during sliding is reduced by the wear preventing bodies 17 (17A and 17B), thereby preventing the sealing member 15 of the application part LP from being damaged. Accordingly, the sealing member 15 can be prevented from being broken, and thus the life span of the polymer actuator device system S22 can be further increased.

Accordingly, since the polymer actuator device system S22 of the invention uses a type of film having two layers of the resin layer 15j and the inorganic layer 15s as the sealing member 15, the sealing member 15 does not have an adverse effect on the deformation of the polymer actuator 23 regardless of a small thickness of 1 to 5 microns and can block the polymer actuator 23 from the outside air. Therefore, release of moisture from the polymer actuator 23 to the outside can be prevented. In addition, due to the configuration in which the wear preventing bodies 17 are provided on the outer side of the sealing member 15, even when a force is to be exerted on the sealing member 15 from the outside, the sealing member 15 can be prevented from being damaged by the wear preventing bodies 17. Accordingly, the sealing member 15 can be prevented from being broken, and thus the life span of the polymer actuator device system S22 can be further increased. Therefore, the polymer actuator device system S22 which uses the sealing member 15 that has a sufficient sealing effect and does not impede the deformation of the polymer actuator 23, and thus has a long life span can be provided.

In addition, since the wear preventing bodies 17 are provided at the application part LP of the polymer actuator device system S22, even when a force is exerted on the application part LP on which the strongest force is exerted from the outside, the sealing member 15 can be further prevented from being damaged by the wear preventing bodies 17. Accordingly, the sealing member 15 can be prevented from being broken, and thus the life span of the polymer actuator device system S22 can be further increased.

In addition, since the structure 28 interposed between the first and second terminals 29A and 29B is provided, the terminal parts are in a reinforced state, and thus the part where the structure 28 is disposed can act as the support part PP of the polymer actuator device system S22. Accordingly, even when a force is exerted on the support part LP on which the strongest force is exerted from the outside, the sealing member 15 can be prevented from being broken, and thus the life span of the polymer actuator device system S22 can be further increased.

Third Embodiment

Figure 10:
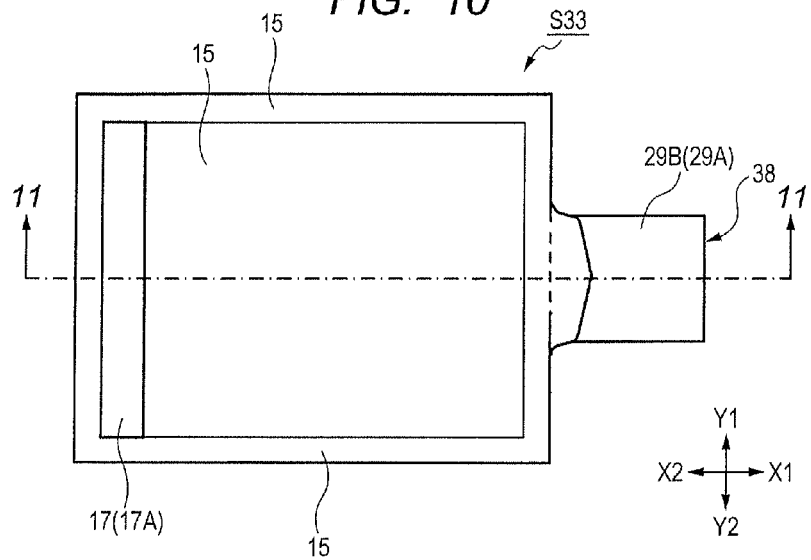
FIG. 10 is a schematic diagram illustrating a polymer actuator device system of a third embodiment of the invention, and is a plan view thereof.
Figure 11:
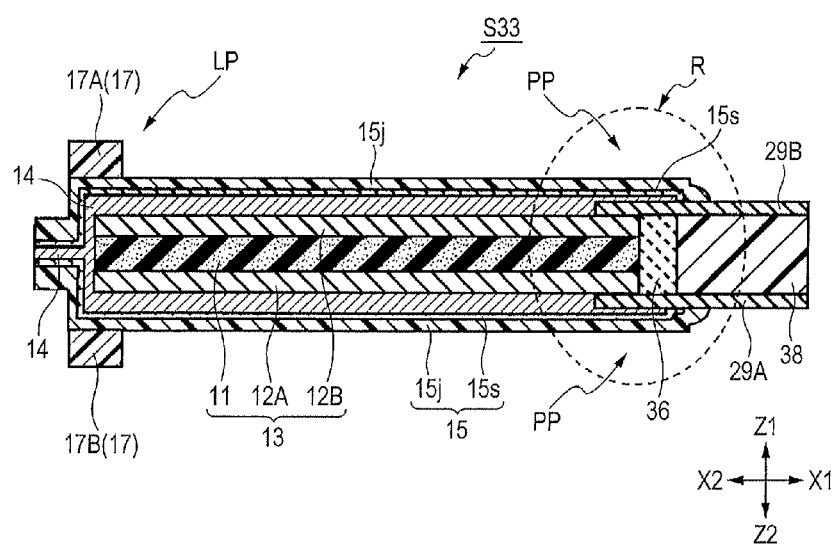
FIG. 11 is a schematic diagram illustrating the polymer actuator device system of the third embodiment of the invention, and is a cross-sectional view taken along line XI-XI illustrated in FIG. 10.
Figure 12:
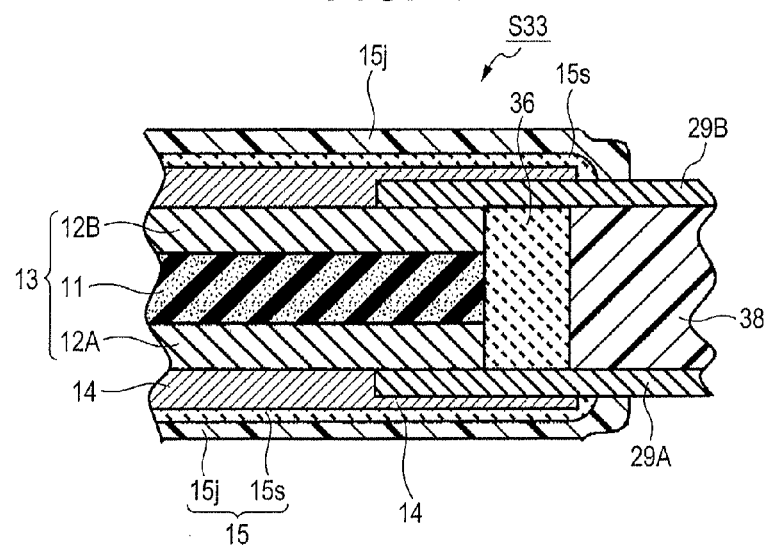
FIG. 12 is a schematic diagram illustrating the polymer actuator device system of the third embodiment of the invention, and is an enlarged cross-sectional view of a part R illustrated in FIG. 11.

FIG. 10 is a schematic diagram illustrating a polymer actuator device system S33 of a third embodiment of the invention, and is a plan view thereof. FIG. 11 is a schematic diagram illustrating the polymer actuator device system S33 of the third embodiment of the invention, and is a cross-sectional view taken along line XI-XI illustrated in FIG. 10. FIG. 12 is a schematic diagram illustrating the polymer actuator device system S33 of the third embodiment of the invention, and is an enlarged cross-sectional view of a part R illustrated in FIG. 11. The polymer actuator device system S33 of the third embodiment is different from that of the second embodiment mainly in that an absorber 36 is provided. In addition, like elements that are the same as those of the first and second embodiments are denoted by like reference numerals, and detailed description thereof will be omitted.

The polymer actuator device system S33 of the third embodiment of the invention is configured by including, as illustrated in FIGS. 10 to 12, the polymer actuator 13 which deforms in response to a voltage, the sealing member 15 which coats the entirety of the polymer actuator 13 to be enclosed therein, the plurality of wear preventing bodies 17 arranged on the outer side in the thickness direction of the sealing member 15, the pair of terminals (the first terminal 29A and the second terminal 29B) for applying a voltage to the polymer actuator 13, a structure 38 interposed between the first and second terminals 29A and 29B, and the absorber 36 which is adjacent to the structure 38.

As in the first embodiment, the polymer actuator 13 is configured by including the electrolyte layer 11, the first electrode layer 12A provided in the thickness direction of the electrolyte layer 11, and the second electrode layer 12B which opposes the first electrode layer 12A with the electrolyte layer 11 interposed therebetween. In addition, as described above using FIGS. 5A and 5B, when power is supplied from the first terminal 29A electrically connected to the first electrode layer 12A and the second terminal 29B electrically connected to the second electrode layer 12B, the polymer actuator 13 deforms in response to the voltage between the first and second electrode layers 12A and 12B. In addition, as in the first embodiment, the electrolyte layer 11 is a gel-like film in which a polymer (resin material) as a base is mixed with an ionic liquid, and the first and second electrode layers 12A and 12B have a gel-like state due to mixing of a conductive filler with a polymer (resin material) as a base and an ionic liquid.

The structure 38 has a sheet-like shape as illustrated in FIGS. 10 to 12 by using a synthetic resin such as polycarbonate (PC) and is disposed at a position interposed between the first and second terminals 29A and 29B.

The absorber 36 has an inorganic material which absorbs moisture, such as silica gel, as a main raw material and is used in a block shape. In addition, the absorber 36 is disposed between the polymer actuator 13 and the sealing member 15 as illustrated in FIGS. 11 and 12. In other words, the absorber is disposed between the structure 38 and the end portion of the polymer actuator 13 and is also disposed at a position interposed between the first and second terminals 29A and 29B. In addition, parts of the first and second terminals 29A and 29B, a part of the structure 28, and the entirety of the absorber 36 are covered with the sealing member 15.

Accordingly, the absorber 36 can absorb moisture that remains in the sealing member 15 after the entirety of the polymer actuator 13 is enclosed in the sealing member 15. Therefore, the electrolyte layer 11 and the electrode layers (12A and 12B) having low resistance to moisture can be protected, and deterioration of the electrolyte layer 11 and the electrode layers (12A and 12B) due to moisture can be further prevented. Accordingly, the life span of the polymer actuator device system S33 can be further increased.

As in the first embodiment, the sealing member 15 is configured by including two layers of the resin layer 15j and the inorganic layer 15s as illustrated in FIGS. 11 and 12, and coats the entirety of the polymer actuator 13 to be enclosed therein as illustrated in FIGS. 10 to 12. In addition, as in the first embodiment, one side of the sealing member 15 is provided with the adhesive layer 14 so that the sealing member 15 adheres to each of the first and second electrode layers 22A and 22B, the first and second terminals 29A and 29B, and the absorber 36 by the adhesive layer 14. Accordingly, since the thickness of the sealing member 15 is 1 to 5 microns and is thus very small, the sealing member 15 does not have an adverse effect on the deformation of the polymer actuator 13 and can block the polymer actuator 13 from the outside air. Accordingly, infiltration of moisture to the polymer actuator 13 from the outside air can be prevented.

The wear preventing bodies 17 are made of a synthetic resin, for example, a film material having a small frictional coefficient such as polytetrafluoroethylene (PTFE), and as illustrated in FIGS. 10 to 12, are provided at two points on the outer side in the thickness direction of the sealing member 15. As illustrated in FIG. 11, the wear preventing bodies 17A and 17B are vertically disposed to have the application part LP (the point of application) interposed therebetween, which is operated by driving the polymer actuator device system S33.

As described above using FIG. 5, the polymer actuator 13 is configured so that one side thereof is fixed (the support part PP) and the other side thereof is bent and deformed to drive a certain object (the application part LP). Therefore, since the polymer actuator device system S33 is used by supporting the support part PP, there is a concern that the thin sealing member 15 of the support part PP may be damaged. Here, when the terminal parts (29A and 29B) reinforced by the structure 38 act as the support part PP of the polymer actuator device system S33, the sealing member 15 of the support part PP can be prevented from being damaged. In addition, the application part LP that drives a certain object is driven while sliding, and thus there is a concern that the thin sealing member 15 of the application part LP may be damaged. Therefore, friction during sliding is reduced by the wear preventing bodies 17 (17A and 17B), thereby preventing the sealing member 15 of the application part LP from being damaged. Accordingly, the sealing member 15 can be prevented from being broken, and thus the life span of the polymer actuator device system S33 can be further increased.

Accordingly, since the polymer actuator device system S33 of the invention uses a type of film having two layers of the resin layer 15j and the inorganic layer 15s as the sealing member 15, the sealing member 15 does not have an adverse effect on the deformation of the polymer actuator 13 regardless of a small thickness of 1 to 5 microns and can block the polymer actuator 13 from the outside air. Therefore, infiltration of moisture from the outside air to the polymer actuator 13 can be prevented. In addition, due to the configuration in which the wear preventing bodies 17 are provided on the outer side of the sealing member 15, even when a force is to be exerted on the sealing member 15 from the outside, the sealing member 15 can be prevented from being damaged by the wear preventing bodies 17. Accordingly, the sealing member 15 can be prevented from being broken, and thus the life span of the polymer actuator device system S33 can be further increased. Therefore, the polymer actuator device system S33 which uses the sealing member 15 that has a sufficient sealing effect and does not impede the deformation of the polymer actuator 13, and thus has a long life span can be provided.

In addition, since the wear preventing bodies 17 are provided at the application part LP of the polymer actuator device system S33, even when a force is exerted on the application part LP on which the strongest force is exerted from the outside, the sealing member 15 can be further prevented from being damaged by the wear preventing bodies 17. Accordingly, the sealing member 15 can be prevented from being broken, and thus the life span of the polymer actuator device system S33 can be further increased.

In addition, since the structure 38 interposed between the first and second terminals 29A and 29B is provided, the terminal parts are in a reinforced state, and thus the part where the structure 38 is disposed can act as the support part PP of the polymer actuator device system S33. Accordingly, even when a force is exerted on the support part PP on which the strongest force is exerted from the outside, the sealing member 15 can be prevented from being broken, and thus the life span of the polymer actuator device system S33 can be further increased.

In addition, since the absorber 36 that absorbs moisture is included between the polymer actuator 13 and the sealing member 15, after the entirety of the polymer actuator 13 is enclosed in the sealing member 15, the absorber 36 can absorb moisture that remains in the sealing member 15. Therefore, the electrolyte layer 11 and the electrode layers (12A and 12B) having low resistance to moisture can be protected, and deterioration of the electrolyte layer 11 and the electrode layers (12A and 12B) due to moisture can be further prevented. Accordingly, the life span of the polymer actuator device system S33 can be further increased.

Fourth Embodiment

Figure 13:
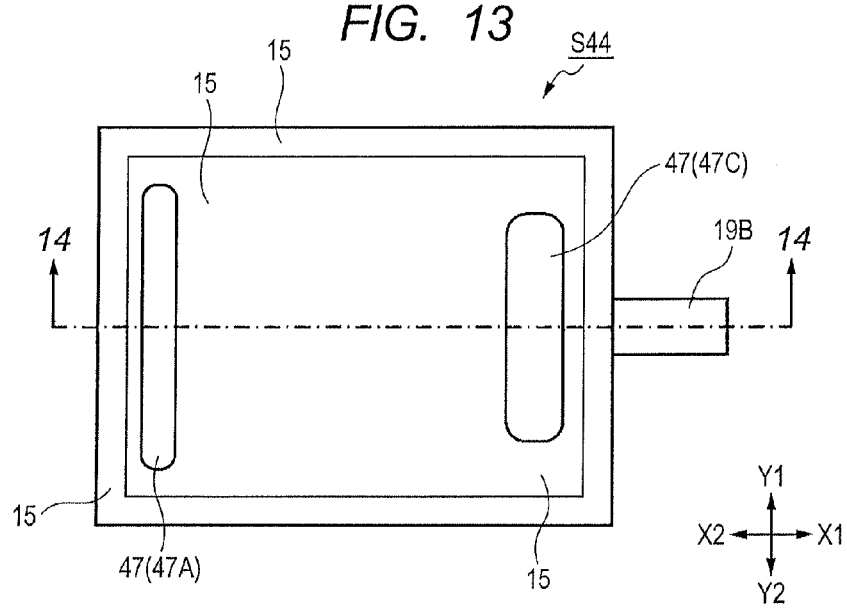
FIG. 13 is a schematic diagram illustrating a polymer actuator device system of a fourth embodiment of the invention, and is a plan view thereof.
Figure 14:
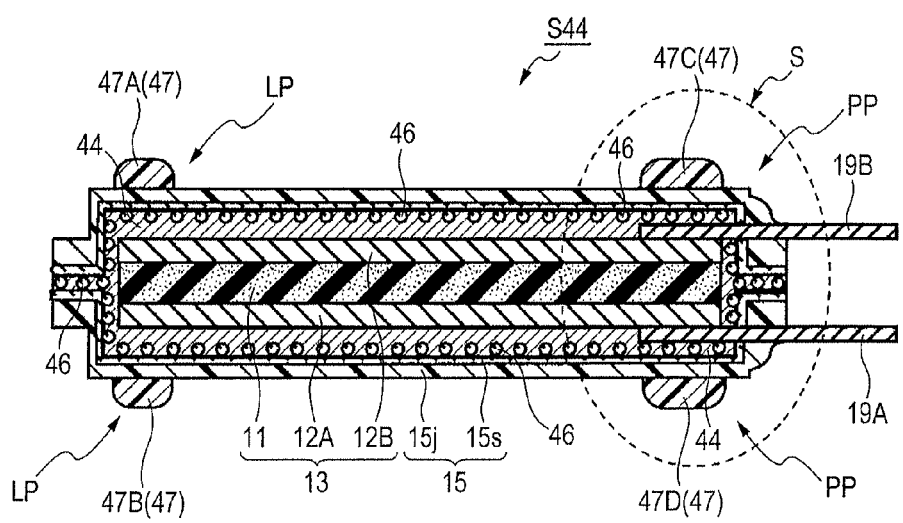
FIG. 14 is a schematic diagram illustrating the polymer actuator device system of the fourth embodiment of the invention, and is a cross-sectional view taken along line XIV-XIV illustrated in FIG. 13.
Figure 15:
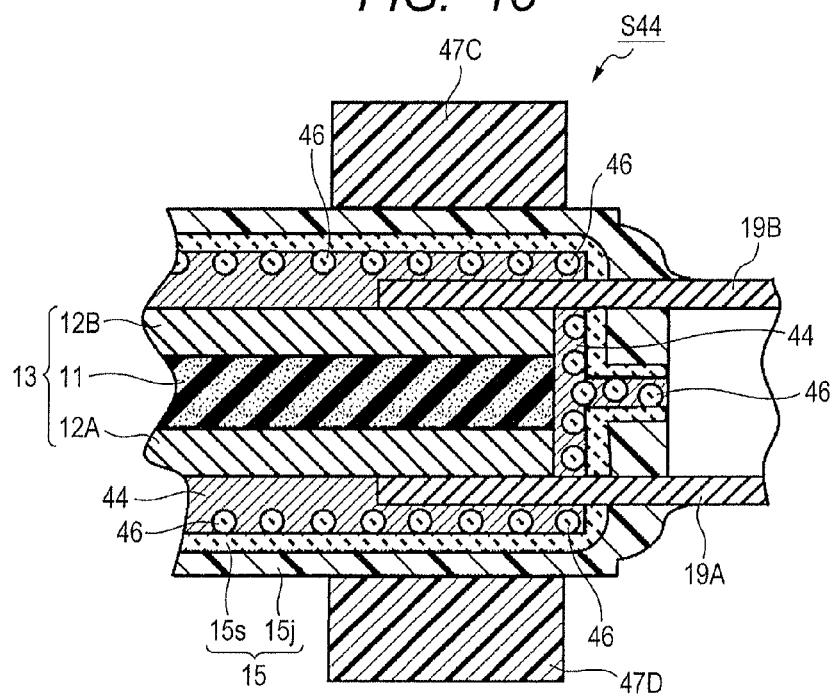
FIG. 15 is a schematic diagram illustrating the polymer actuator device system of the fourth embodiment of the invention, and is an enlarged cross-sectional view of a part S illustrated in FIG. 14.

FIG. 13 is a schematic diagram illustrating a polymer actuator device system S44 of a fourth embodiment of the invention, and is a plan view thereof. FIG. 14 is a schematic diagram illustrating the polymer actuator device system S44 of the fourth embodiment of the invention, and is a cross-sectional view taken along line XIV-XIV illustrated in FIG. 13. FIG. 15 is a schematic diagram illustrating the polymer actuator device system S44 of the fourth embodiment of the invention, and is an enlarged cross-sectional view of a part S illustrated in FIG. 14. The polymer actuator device system S44 of the fourth embodiment is different from that of the first embodiment mainly in that an absorber 46 is provided. In addition, like elements that are the same as those of the first embodiment are denoted by like reference numerals, and detailed description thereof will be omitted.

The polymer actuator device system S44 of the fourth embodiment of the invention is configured by including, as illustrated in FIGS. 13 to 15, the polymer actuator 13 which deforms in response to a voltage, the sealing member 15 which coats the entirety of the polymer actuator 13 to be enclosed therein, a plurality of wear preventing bodies 47 arranged on the outer side in the thickness direction of the sealing member 15, and the granular absorber 46 which is provided on one side of the sealing member 15. Moreover, the pair of terminals (the first terminal 19A and the second terminal 19B) for applying a voltage to the polymer actuator 13 are provided.

As in the first embodiment, the polymer actuator 13 is configured by including the electrolyte layer 11, the first electrode layer 12A provided in the thickness direction of the electrolyte layer 11, and the second electrode layer 12B which opposes the first electrode layer 12A with the electrolyte layer 11 interposed therebetween. In addition, as described above using FIGS. 5A and 5B, when power is supplied from the first terminal 19A electrically connected to the first electrode layer 12A and the second terminal 19B electrically connected to the second electrode layer 12B, the polymer actuator 13 deforms in response to the voltage between the first and second electrode layers 12A and 12B. In addition, as in the first embodiment, the electrolyte layer 11 is a gel-like film in which a polymer (resin material) as a base is mixed with an ionic liquid, and the first and second electrode layers 12A and 12B have a gel-like state due to mixing of a conductive filler with a polymer (resin material) as a base and an ionic liquid.

As in the first embodiment, the sealing member 15 is configured by including two layers of the resin layer 15j and the inorganic layer 15s as illustrated in FIGS. 14 and 15, and coats the entirety of the polymer actuator 13 to be enclosed therein as illustrated in FIGS. 13 to 15. In addition, as in the first embodiment, one side of the sealing member 15 is provided with an adhesive layer 44 so that the sealing member 15 adheres to each of the polymer actuator 13 and portions of the first and second terminals 19A and 19B by the adhesive layer 44. Accordingly, since the thickness of the sealing member 15 is 1 to 5 microns and is thus very small, the sealing member 15 does not have an adverse effect on the deformation of the polymer actuator 13 and can block the polymer actuator 13 from the outside air. Accordingly, infiltration of moisture to the polymer actuator 13 from the outside air can be prevented.

The absorber 46 has an inorganic material which absorbs moisture, such as silica gel, as a main raw material in the form of a granular powder and is provided on the side of the sealing member 15 of the adhesive layer 44 as illustrated in FIGS. 14 and 15. Accordingly, the absorber 46 can absorb moisture that remains in the sealing member 15 after the entirety of the polymer actuator 13 is enclosed in the sealing member 15. Therefore, the electrolyte layer 11 and the electrode layers (12A and 12B) having low resistance to moisture can be protected, and deterioration of the electrolyte layer 11 and the electrode layers (12A and 12B) due to moisture can be further prevented. Accordingly, the life span of the polymer actuator device system S44 can be further increased.

Moreover, since the absorber 46 is a granular powder, even when a larger amount of the absorber 46 is provided in the adhesive layer 44 between the polymer actuator 13 and the sealing member 15, deformation of the polymer actuator 13 is less impeded. Accordingly, the polymer actuator device system S44 is easily deformed.

Moreover, since the absorber 46 is provided on the side of the sealing member 15, the absorber 46 is consequently disposed at a position separated from the polymer actuator 13. Therefore, an adverse effect of the absorber 46 that absorbs moisture on the polymer actuator 13 can be reduced. Accordingly, the life span of the polymer actuator device system S44 can be even further increased.

The wear preventing bodies 47 are made of a synthetic resin, for example, a film material having a small frictional coefficient such as perfluoroalkoxyalkane (PFA), and as illustrated in FIGS. 14 and 15, are provided at four points on the outer side in the thickness direction of the sealing member 15. As illustrated in FIG. 11, the wear preventing bodies 47A and 47B are vertically disposed to have the application part LP (the point of application) interposed therebetween, which is operated by driving the polymer actuator device system S44. In addition, as illustrated in FIGS. 14 and 15, the wear preventing bodies 47C and 47D are vertically provided to have the support part PP (fulcrum) of the polymer actuator device system S44 interposed therebetween.

Accordingly, since the polymer actuator device system S44 of the invention uses a type of film having two layers of the resin layer 15$j$ and the inorganic layer 15$s$ as the sealing member 15, the sealing member 15 does not have an adverse effect on the deformation of the polymer actuator 13 regardless of a small thickness of 1 to 5 microns and can block the polymer actuator 13 from the outside air. Therefore, infiltration of moisture from the outside air to the polymer actuator 13 can be prevented. In addition, due to the configuration in which the wear preventing bodies 47 are provided on the outer side of the sealing member 15, even when a force is to be exerted on the sealing member 15 from the outside, the sealing member 15 can be prevented from being damaged by the wear preventing bodies 47. Accordingly, the sealing member 15 can be prevented from being broken, and thus the life span of the polymer actuator device system S44 can be further increased. Therefore, the polymer actuator device system S44 which uses the sealing member 15 that has a sufficient sealing effect and does not impede the deformation of the polymer actuator 13, and thus has a long life span can be provided.

In addition, since the absorber 46 that absorbs moisture is included between the polymer actuator 13 and the sealing member 15, after the entirety of the polymer actuator 13 is enclosed in the sealing member 15, the absorber 46 can absorb moisture that remains in the sealing member 15. Therefore, the electrolyte layer 11 and the electrode layers (12A and 12B) having low resistance to moisture can be protected, and deterioration of the electrolyte layer 11 and the electrode layers (12A and 12B) due to moisture can be further prevented. Accordingly, the life span of the polymer actuator device system S44 can be further increased.

Moreover, since the absorber 46 is a granular powder, even when a larger amount of the absorber 46 is provided in the adhesive layer 44 between the polymer actuator 13 and the sealing member 15, deformation of the polymer actuator 13 is less impeded. Accordingly, the polymer actuator device system S44 is easily deformed. Moreover, since the absorber 46 is provided on the side of the sealing member 15, the absorber 46 is consequently disposed at a position separated from the polymer actuator 13. Therefore, an adverse effect of the absorber 46 that absorbs moisture on the polymer actuator 13 can be reduced. Accordingly, the life span of the polymer actuator device system S44 can be even further increased.

Fifth Embodiment

Figure 16:
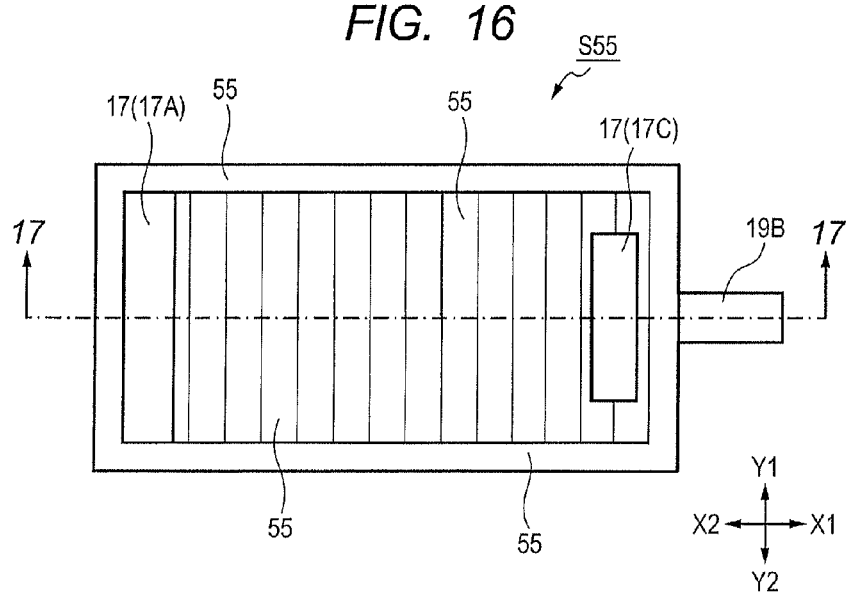
FIG. 16 is a schematic diagram illustrating a polymer actuator device system of a fifth embodiment of the invention, and is a plan view thereof.
Figure 17:
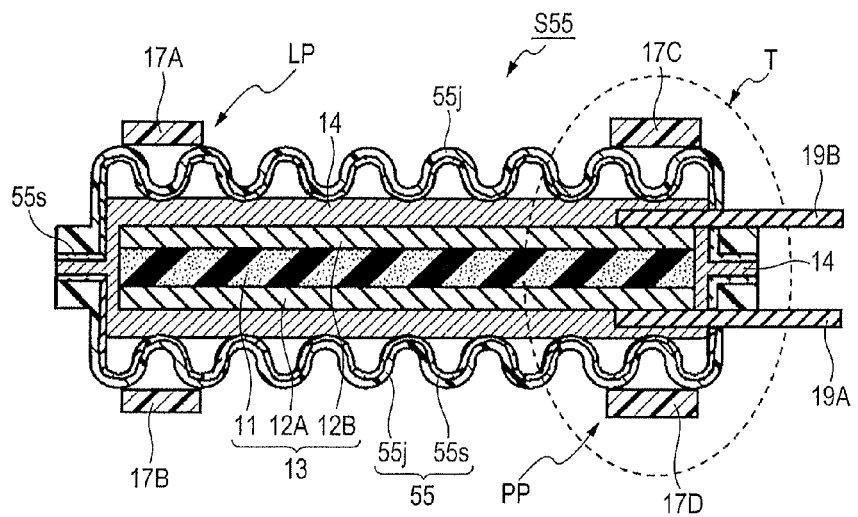
FIG. 17 is a schematic diagram illustrating the polymer actuator device system of the fifth embodiment of the invention, and is a cross-sectional view taken along line XVII-XVII illustrated in FIG. 16.
Figure 18:
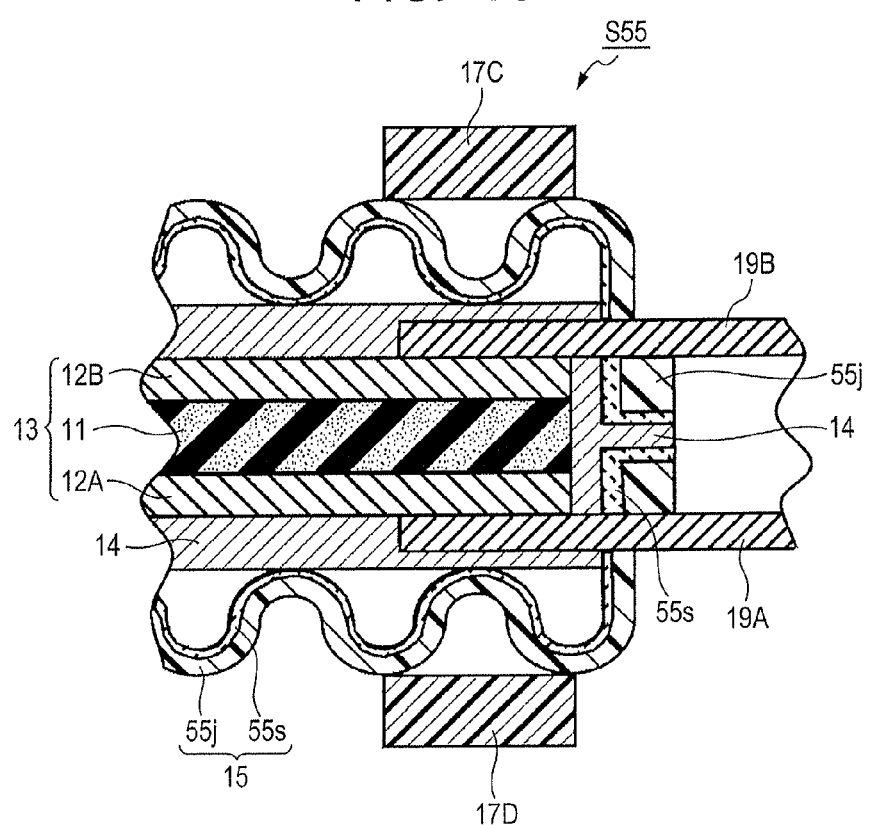
FIG. 18 is a schematic diagram illustrating the polymer actuator device system of the fifth embodiment of the invention, and is an enlarged cross-sectional view of a part T illustrated in FIG. 17.

FIG. 16 is a schematic diagram illustrating a polymer actuator device system S55 of a fifth embodiment of the invention, and is a plan view thereof. FIG. 17 is a schematic diagram illustrating the polymer actuator device system S55 of the fifth embodiment of the invention, and is a cross-sectional view taken along line XVII-XVII illustrated in FIG. 16. FIG. 18 is a schematic diagram illustrating the polymer actuator device system S55 of the fifth embodiment of the invention, and is an enlarged cross-sectional view of a part T illustrated in FIG. 17. The polymer actuator device system S55 of the fifth embodiment is different from that of the first embodiment in the shape of a sealing member 55. In addition, like elements that are the same as those of the first embodiment are denoted by like reference numerals, and detailed description thereof will be omitted.

The polymer actuator device system S55 of the fifth embodiment of the invention is configured by including, as illustrated in FIGS. 16 to 18, a polymer actuator 13 which deforms in response to a voltage, the sealing member 55 which coats the entirety of the polymer actuator 13 to be enclosed therein, and the plurality of wear preventing bodies 17 arranged on the outer side in the thickness direction of the sealing member 55. Moreover, the pair of terminals (the first terminal 19A and the second terminal 19B) for applying a voltage to the polymer actuator 13 are provided.

As in the first embodiment, the polymer actuator 13 is configured by including the electrolyte layer 11, the first electrode layer 12A provided in the thickness direction of the electrolyte layer 11, and the second electrode layer 12B which opposes the first electrode layer 12A with the electrolyte layer 11 interposed therebetween. In addition, as described above using FIGS. 5A and 5B, when power is supplied from the first terminal 19A electrically connected to the first electrode layer 12A and the second terminal 19B electrically connected to the second electrode layer 12B, the polymer actuator 13 deforms in response to the voltage between the first and second electrode layers 12A and 12B. In addition, as in the first embodiment, the electrolyte layer 11 is a gel-like film in which a polymer (resin material) as a base is mixed with an ionic liquid, and the first and second electrode layers 12A and 12B have a gel-like state due to mixing of a conductive filler with a polymer (resin material) as a base and an ionic liquid.

As in the first embodiment, the sealing member 55 is configured by including two layers of a resin layer 55$j$ and an inorganic layer 55$s$, and as illustrated in FIGS. 17 and 18, a portion of the sealing member 55 has a bellows shape to coat the entirety of the polymer actuator 13 to be enclosed therein. In addition, as in the first embodiment, one side of the sealing member 55 is provided with the adhesive layer 14 so that the sealing member 55 adheres to the polymer actuator 13 and portions of the first and second terminals 29A and 29B by the adhesive layer 14. Accordingly, since the thickness of the sealing member 55 is 1 to 5 microns and is thus very small, the sealing member 55 does not have an adverse effect on the deformation of the polymer actuator 13 and can block the polymer actuator 13 from the outside air. Accordingly, infiltration of moisture to the polymer actuator 13 from the outside air can be prevented. In addition, since the portion of the sealing member 55 has a bellows shape, adhesion between the sealing member 55 and the polymer actuator 13 is achieved not over the entire surface but in spots as illustrated in FIGS. 17 and 18.

Moreover, in the fifth embodiment of the invention, since the portion of the sealing member 55 has a bellows shape, the bellows-shaped portion thereof acts as a margin part of the sealing member 55, so that deformation of the polymer actuator 13 is not impeded during the deformation of the polymer actuator 13. Accordingly, the polymer actuator device system S55 is further easily deformed.

In addition, when sealing is performed by enclosing the polymer actuator 13 in the sealing member 55 having the bellows shape, dry air or an inert gas such as argon or nitrogen may be sealed in gaps between the sealing member 55 and the polymer actuator 13. Accordingly, regarding the electrolyte layer 11 and the electrode layers (12A and 12B) having low resistance to moisture, deterioration due to moisture can be further prevented. Accordingly, the life span of the polymer actuator device system S55 can be further increased.

Accordingly, since the polymer actuator device system S55 of the invention uses a type of film having two layers of the resin layer 55*j* and the inorganic layer 55*s* as the sealing member 55, the sealing member 55 does not have an adverse effect on the deformation of the polymer actuator 13 regardless of a small thickness of 1 to 5 microns and can block the polymer actuator 13 from the outside air. Therefore, infiltration of moisture from the outside air to the polymer actuator 13 can be prevented. In addition, due to the configuration in which the wear preventing bodies 17 are provided on the outer side of the sealing member 55, even when a force is to be exerted on the sealing member 55 from the outside, the sealing member 55 can be prevented from being damaged by the wear preventing bodies 17. Accordingly, the sealing member 55 can be prevented from being broken, and thus the life span of the polymer actuator device system S55 can be further increased. Therefore, the polymer actuator device system S55 which uses the sealing member 55 that has a sufficient sealing effect and does not impede the deformation of the polymer actuator 13, and thus has a long life span can be provided.

In addition, since the portion of the sealing member 55 has a bellows shape, the bellows-shaped portion thereof acts as a margin part of the sealing member 55, so that deformation of the polymer actuator 13 is not impeded during the deformation of the polymer actuator 13. Accordingly, the polymer actuator device system S55 is further easily deformed.

In addition, the invention is not limited to the embodiments and for example, can be embodied as the following modifications, and such embodiments also belong to the technical scope of the invention.

Figure 19A:
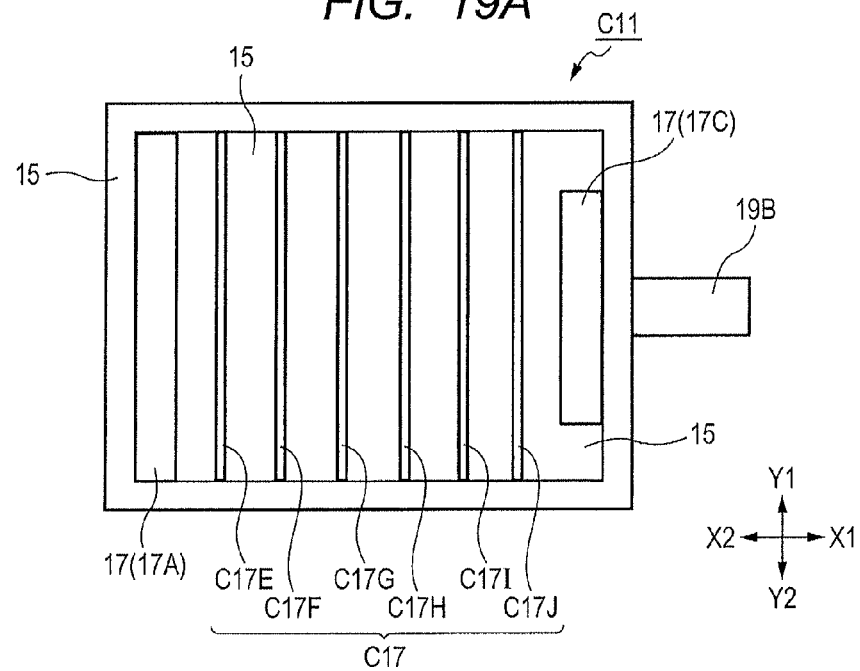
FIGS. 19A and 19B are schematic diagrams illustrating modification examples of the polymer actuator device system of the first embodiment of the invention.
Figure 19B:
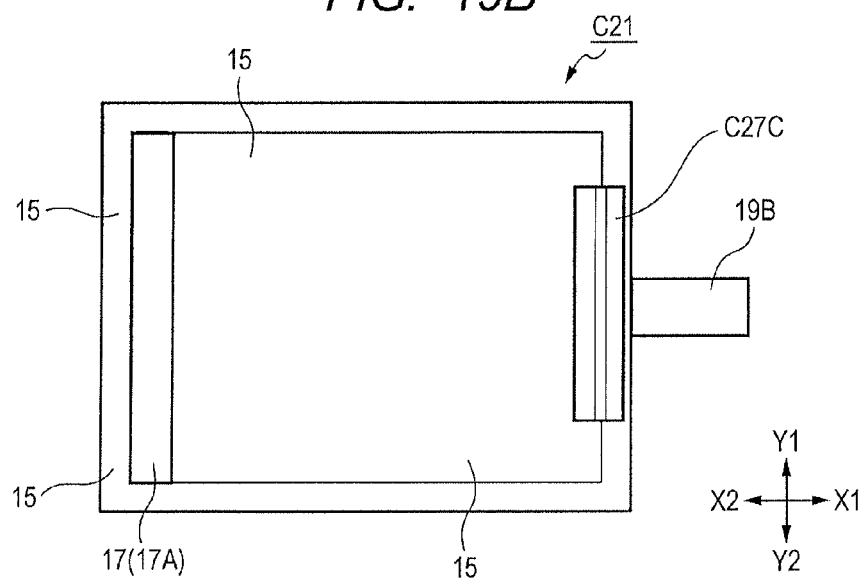
Figure 20A:
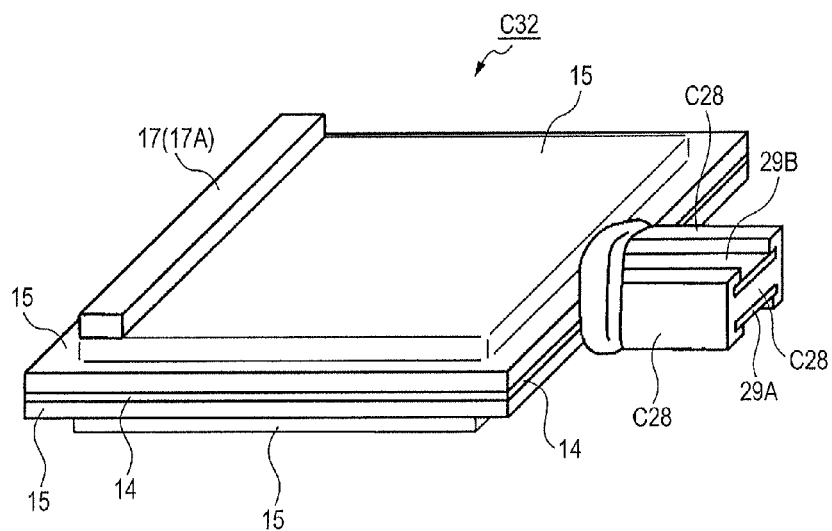
FIGS. 20A and 20B are schematic diagrams illustrating modification examples of the polymer actuator device system of the second embodiment of the invention.
Figure 20B:
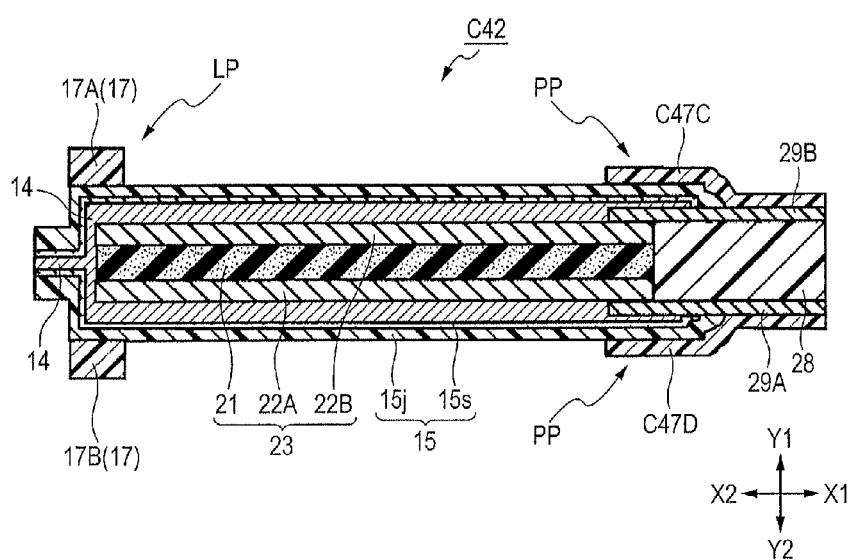
Figure 21:
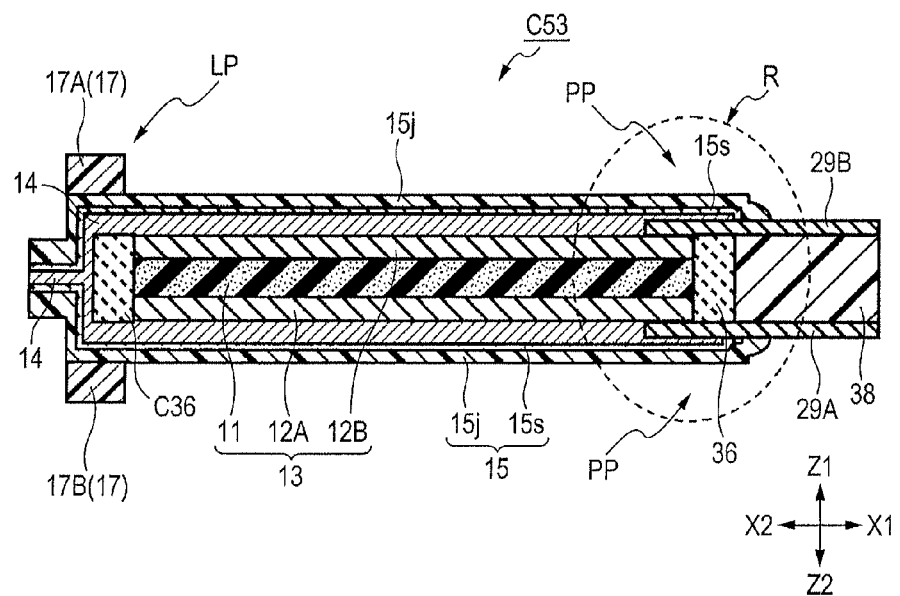
FIG. 21 is a schematic diagram illustrating a modification example of a polymer actuator device system of the second embodiment of the invention, and is a cross-sectional view of a polymer actuator device system of a modification example 5 compared to FIG. 11.
Figure 22:
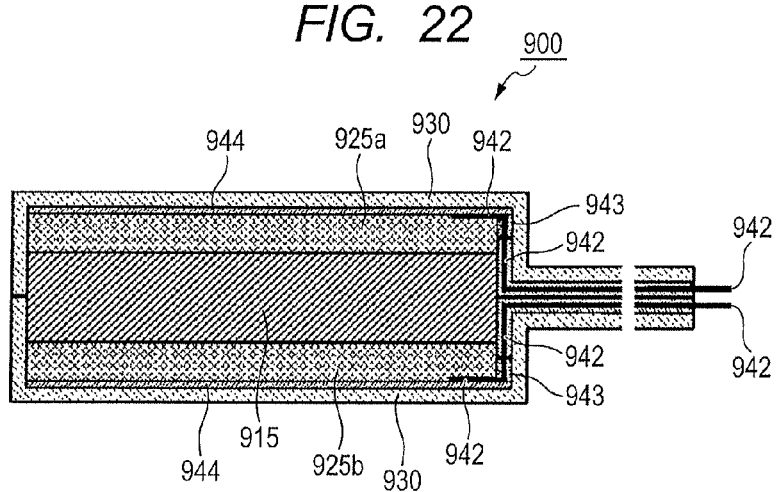
FIG. 22 is a cross-sectional view illustrating the structure of an actuator of an example according to the related art.

FIGS. 19A and 19B are schematic diagrams illustrating modification examples of the polymer actuator device system S11 of the first embodiment of the invention, FIG. 19A is a plan view of a polymer actuator device system C11 of a modification example 1 compared to FIG. 2, and FIG. 19B is a plan view of a polymer actuator device system C21 of a modification example 2 compared to FIG. 2. FIGS. 20A and 20B are schematic diagrams illustrating modification examples of the polymer actuator device system S22 of the second embodiment of the invention, FIG. 20A is a perspective view of a polymer actuator device system C32 of a modification example 3 compared to FIG. 6, and FIG. 20B is a cross-sectional view of a polymer actuator device system C42 of a modification example 4 compared to FIG. 8. FIG. 21 is a schematic diagram illustrating a modification example of a polymer actuator device system S33 of the second embodiment of the invention, and is a cross-sectional view of a polymer actuator device system C53 of a modification example 5 compared to FIG. 11.

Modification Example 1

In the first embodiment, the wear preventing bodies 17 are configured to be disposed at four points of the application part LP and the support part PP, but the disposed positions are not limited to the application part LP and the support part PP, and for example, as illustrated in FIG. 19A, wear preventing bodies C17 (C17E, C17F, C17G, C17I, and C17J) may be disposed at any positions other than the application part LP and the support part PP. Accordingly, even when any external force is exerted on the polymer actuator device system C11, the sealing member 55 can be further prevented from being damaged by the wear preventing bodies 17. Here, so as not to impede the progress of deformation of the polymer actuator 13, the widths, lengths, disposed positions, and the like of the wear preventing bodies C17 have to be considered.

Modification Example 2

In the first embodiment, the wear preventing bodies 17C are provided on the flat surface parts of the sealing member 15. However, as illustrated in FIG. 19B, a wear preventing body C27C may be configured to extend to the shielding part of the sealing member 15. In addition, although not illustrated in the figure, the wear preventing body 17D may also extend in the same manner.

Modification Example 3

In the second embodiment, the structure 28 is interposed between both the first and second terminals 29A and 29B. However, as illustrated in FIG. 20A, a structure C28 may extend to cover the side end portions of the first and second terminals 29A and 29B.

Modification Example 4

In the second embodiment, the wear preventing bodies 17C are provided on the flat surface parts of the sealing member 15. However, as illustrated in FIG. 20B, a wear preventing body C47C may be configured to extend to the part of the second terminal 29B. In addition, although not illustrated in the figure, the wear preventing body 17D may also extend in the same manner to have the first and second terminals 29A and 29B interposed therebetween.

Modification Example 5

In the third embodiment, the absorber 36 is configured to be disposed between the structure 38 and the end portion of the polymer actuator 13. However, as illustrated in FIG. 21, an absorber C36 may be further provided at the opposite side end portion of the polymer actuator 13.

Modification Example 6

In the above embodiments, the inorganic layer (15*s* or 55*s*) side of the sealing member (15 or 55) is used to oppose the polymer actuator (13 or 23). However, the resin layer side may be used to oppose the polymer actuator (13 or 23).

The invention is not limited to the above embodiments and can be appropriately modified without departing from the scope of the object of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A polymer actuator device system comprising:
   a polymer actuator, which includes an electrolyte layer, a first electrode layer and a second electrode layer provided to oppose each other with the electrolyte layer interposed therebetween in a thickness direction of the electrolyte layer, and wherein the polymer actuator deforms in response to a voltage between the first and second electrode layers; and a sealing member, which coats an entirety of the polymer actuator to be enclosed therein, wherein the sealing member has two layers of a resin layer and an inorganic layer, a thickness of the sealing member is 1 to 5 microns, and an outer side of the sealing member in the thickness direction has a wear preventing body.

2. The system according to claim 1, wherein the wear preventing body is provided at at least any of a support part of the polymer actuator device system and an application part which is driven in the polymer actuator device system.

3. The system according to claim 1, further comprising:

a first terminal, which is electrically connected to the first electrode layer to apply the voltage thereto, and a second terminal, which is electrically connected to the second electrode layer to apply the voltage thereto; and a structure interposed between the first and second terminals, wherein portions of the first and second terminals and at least a portion of the structure are covered with the sealing member.

4. The system according to claim 1, wherein a portion of the sealing member has a bellows shape.

5. The system according to claim 1, further comprising:

an absorber, which is provided between the polymer actuator and the sealing member and absorbs moisture.

6. The system according to claim 5, wherein:

the absorber is a granular powder, one side of the sealing member has an adhesive layer which causes the sealing member to adhere to the polymer actuator, and the absorber is provided on a side of the sealing member of the adhesive layer.

* * * * *